United States Patent [19]

Abrahams et al.

[11] Patent Number: 4,740,975
[45] Date of Patent: Apr. 26, 1988

[54] CONGRUENTLY MELTING COMPLEX OXIDES

[75] Inventors: Sidney C. Abrahams, Murray Hill; Charles D. Brandle, Jr., Basking Ridge, both of N.J.

[73] Assignee: American Telephone and Telegraph Company, AT&T Bell Laboratories, Murray Hill, N.J.

[21] Appl. No.: 34,116

[22] Filed: Apr. 1, 1987

Related U.S. Application Data

[63] Continuation-in-part of Ser. No. 32,893, Mar. 31, 1987, abandoned.

[51] Int. Cl.[4] ................................................ H01S 3/16
[52] U.S. Cl. ........................................ 372/41; 372/27; 372/21; 372/22
[58] Field of Search ........................ 372/41, 27, 21, 22

[56] References Cited

PUBLICATIONS

Shintaro Miyazawa et al. "Congruent Melting Composition of Lithium Metatantalate"; *Jour. of Crystal Growth;* pp. 276–278, vol. 10; 1971.

*Primary Examiner*—Léon Scott, Jr.
*Attorney, Agent, or Firm*—Bernard Tiegerman

[57] ABSTRACT

The invention involves the finding that the congruent composition of any complex oxide is non-stoichiometric.

15 Claims, 1 Drawing Sheet

CONGRUENTLY MELTING COMPLEX OXIDES

CROSS-REFERENCE TO RELATED APPLICATION

This is a continuation-in-part of a U.S. patent application designated S. C. Abrahams—C. D. Brandle, Jr. Ser. No. 32,893, filed by S. C. Abrahams and C. D. Brandle, Jr. on Mar. 31, 1987.

BACKGROUND OF THE INVENTION

This invention relates to complex oxides, such as gadolinium scandium gallium garnet.

Garnet materials have a number of diverse technological applications. They are used, for example, as the substrate for magnetic bubble domain devices and as the host for the active light-emitting species of solid state lasers.

Gadolinium scandium gallium garnet (GSGG), which was first prepared by C. D. Brandle et al. (*Journal of Crystal Growth*, Vol. 20, p. 1, (1973)) using the Czochralski technique, recently has been used as a host material for Cr-doped tunable lasers (P. F. Moulton, *Laser Focus*, p. 83, May 1983) and for Nd:Cr-doped high power solid state lasers (E. V. Zharikov et al., *Soviet Journal of Quantum Electronics*, Vol. 14, p. 1056 (1984)). However, uniform crystals are important for laser applications. Achieving uniformity requires an accurate knowledge of the congruently melting composition; that is, the composition at which the growing crystal has the same composition as the melt from which it is grown.

The garnet structure is a complex oxide network that contains three dodecahedral, two octahedral, and three tetrahedral sites per formula unit. The natural site distribution is gadolinium (ionic radius $r_i = 1.053$ Angstrom) on the large dodecahedral site, scandium ($r_i = 0.745$ Angstrom) on the medium sized octahedral site, and gallium ($r_i = 0.47$ Angstrom) on the small tetrahedral site. However, it is known from other garnets that there can be small off-site distributions of these ions, namely: (1) Gallium is readily incorporated on the octahedral site in a variety of rare earth gallium garnets; (2) Gadolinium is incorporated octahedrally in gadolinium gallium garnet (GGG), C. D. Brandle et al., *Journal of Crystal Growth*, Vol. 26, p. 169 (1974); and (3) Scandium is incorporated dodecahedrally in gadolinium scandium aluminum garnet, C. D. Brandle et al. (1973), supra. Any or all of these mechanisms may affect the congruent composition of GSGG. The total distribution coefficients of all three components must be equal to unity to grow a crystal of uniform composition.

Previous researchers used lattic parameter measurements to determine the compositional uniformity of GSGG. Brandle et al. (1973), supra, compared their lattice parameter data to their calculated values and concluded that there must be octahedral gadolinium in these crystals. K. Chow et al. (*Journal of Crystal Growth*, Vol. 23, p. 58, (1974)) used lattice parameter data from sintered (ceramic) samples to conclude that the congruent melting composition was $Gd_{3.0}Sc_{1.6}Ga_{3.4}O_{12}$. Such determinations based on one variable are not sufficient to solve a three component system, especially with the added complication of off-site distributions of more than one ion. Consequently, we have determined that the Chow et al. congruent melting composition is inaccurate and that GSGG crystals grown in reliance on it suffer from considerable lack of uniformity.

SUMMARY OF THE INVENTION

In accordance with one aspect of our invention, the congruently melting composition of GSGG single crystals comprises

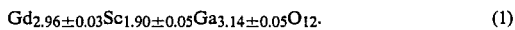

$$Gd_{2.96\pm 0.03}Sc_{1.90\pm 0.05}Ga_{3.14\pm 0.05}O_{12}. \quad (1)$$

A preferred composition determined via X-ray fluorescence comprises $Gd_{2.957}Sc_{1.905}Ga_{3.138}O_{12}$ or, expressed on a site-by-site basis, comprises

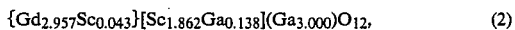

$$\{Gd_{2.957}Sc_{0.043}\}[Sc_{1.862}Ga_{0.138}](Ga_{3.000})O_{12}, \quad (2)$$

where the braces denote the dodecahedral sites, the brackets denote the octahedral sites, and the parentheses denote the tetrahedral sites. The presence of 0.043 formula unit of dodecahedral Sc was unexpected and plays an important role in reducing the lattice parameter of the GSGG single crystals.

Good quality, highly uniform single crystals of suitable quality for active media of solid state lasers or for substrates of bubble domain devices have been prepared. The laser material was grown with suitable concentrtions of $Nd^{+3}$ and $Cr^{+3}$ to produce stimulated emission at about 1.06 $\mu$m from the $Nd^{+3}$ activator. Nd:Cr-doped GSGG crystals grown using our composition show improved optical quality and hence better laser performance. In addition, fabrication of large slab lasers (e.g., $10 \times 20 \times 1$ cm) is realizable because of the uniform optical quality of our material.

Another advantage of our invention is that utilization of the melt (i.e., the fraction of the liquid melt crystallized) is significantly increaed from the prior art 30 to 50 percent to a value of 80 to 90 percent. This increased yield implies lower unit costs.

In accordance with another aspect of our invention, the congruent melting composition of GSGG is prepared by a Czochralski growth process which includes pre-heating of compacted oxide powders of the GSGG constituents at an elevated temperature (e.g., about 1173°–1973° K.) below the melting point to chemically bind the gallium oxide into low vapor pressure phases, thus reducing gallium oxide evaporation at the relatively high temperatures (e.g., about 2148°–2173° K.) required to melt this garnet material.

BRIEF DESCRIPTION OF THE DRAWING

The invention is described with reference to the accompanying drawings, wherein.

DETAILED DESCRIPTION

Figure 1:
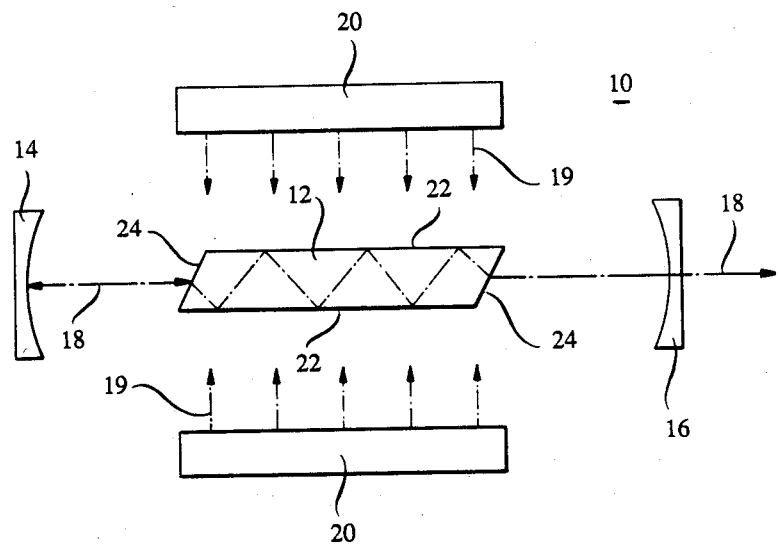
FIG. 1 is a schematic of a solid state laser, in accordance with one embodiment of the invention.

With reference to FIG. 1, there is shown an illustrative solid state laser 10 comprising a solid active medium 12 disposed along the axis of a cavity resonator formed by a pair of separated, concave reflectors 14 and 16. Typically, reflector 14 is nearly 100 percent reflective whereas reflector 16 is partially transmissive to allow egress of a useful output light beam 18. Pumping energy is supplied to the active medium 12 in order to create a population inversion therein by pumping means 20 well known in the art. The energy is often provided by electromagnetic waves 19 in the optical portion of the frequency spectrum. Thus, pumping means 20 may be a flashlamp or a laser which generates optical radiation of a wavelength which is absorbed in the active medium and of an intensity sufficient to create a population inversion. A flashlamp pumping means is typically employed for high power, pulsed operation whereas laser pumping means is typically used for lower power, continuous wave (CW) operation. In the pulsed mode, the active medium typically has the shape of a cylindrical rod, but in the CW case its shape is that of a slab; i.e., a rhombohedron with parallel major surfaces 22 through which the pumping radiation is absorbed and parallel end surfaces 24 through which the lasing light enters and exits the active medium 12. The end surfaces 24 are oriented at Brewster's angle to the major surfaces 22. Within the medium 12 the lasing radiation propagates along a zig-zag path caused by total internal reflection at the major surfaces 22.

In accordance with one embodiment of our invention, the active medium 12 comprises a GSGG single crystal host doped with suitable activators, and the host has a congruently melting composition given by

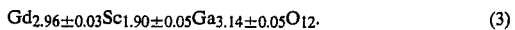

$$Gd_{2.96\pm0.03}Sc_{1.90\pm0.05}Ga_{3.14\pm0.05}O_{12}. \qquad (3)$$

In a preferred embodiment, the host comprises

$$Gd_{2.957}Sc_{1.905}Ga_{3.138}O_{12}. \qquad (4)$$

Suitable activators are many depending on the desired wavelength of operation. For example, when $Cr^{+3}$ is used as the activator, the laser emits at about 745-820 nm. But, when $Nd^{+3}$ and $Cr^{+3}$ are used, the laser emits at 1.06 μm characteristic of $Nd^{+3}$, and the $Cr^{+3}$ serves to enhance the efficiency of absorption of the pumping radiation and to transfer the pumping energy to the $Nd^{+3}$ upper laser level.

Because our congruently melting composition enables the growth of optically uniform single crystal boules, relatively large (e.g., 10×20×1 cm) slabs, with optically uniform characteristics throughout, can be cut from the boules and used as active media for solid state lasers with enhanced performance.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention. In particular, our congruently melting composition of GSGG may be used as the substrate of a magnetic domain device as described by Brandle et al. (1973), supra, or of a magneto-optic device as described by C. P. Klages and W. Tolksdorf, *Journal of Crystal Growth*, Vol. 64, 1983, pp. 275-284. Briefly, an epitaxial layer of a magnetic garnet is grown on the substrate, and a suitable electrode pattern is formed on the epitaxial layer to control the propagation of magnetic bubble domains in magnetic bubble devices, or to reverse the magnetization direction in the magnetic domains of magneto-optic devices.

As discussed above, it has been found that the congruent composition of GSGG is not the stoichiometric composition. In addition, as described by C. D. Brandle, Jr. in "Growth of 3" Diameter Gd₃Ga₅O₁₂ Crystals," *Journal of Applied Physics*, Vol. 49, No. 3, March 1978, pp. 1855-1858, it has been found that the congruent composition of gadolinium gallium garnet (GGG) is nonstoichiometric. Further, and as discussed in U.S. patent application Ser. No. 781,408 filed by C. D. Brandle, Jr., P. K. Gallagher and H. M. O'Bryan, Jr., on Sept. 27, 1985, it has also been found that the congruent composition of lithium niobate is different from the stoichiometric composition. These three (apparently unconnected) findings are related in the sense that GSGG, GGG and lithium niobate are each complex oxides which have a composition in the solid which is identical to that of the liquid only at a non-stoichiometric, congruent composition. (For purposes of this disclosure, a complex oxide is a compound which includes only oxygen anions and two or more different cations. In addition, a complex oxide has a stoichiometric composition only if the ratio of the number of atoms of each element in the crystallographic unit cell to the nearest integer differs from unity by less than about 0.001 when measured by conventional techniques, such as x-ray fluorescence, to within a corresponding accuracy of about 0.1 atomic percent.) These three findings are significant, at least in part, because they are inconsistent with the universally held prior belief that the congruent composition of any solid complex oxide (which is stable at its melting temperature) is the corresponding stoichiometric composition. However, these findings have only been viewed as curious exceptions to the above-described belief, which is still assumed to be true for all other complex oxides. For example, it is still believed that the congruent composition of lanthanum magnesium aluminate (LMA), a complex oxide proposed for use as a laser and/or phosphor host material, is the stoichiometric composition. (See, e.g., D. Vivien et al, "A new monocrystalline laser material: LNA," *International Review of High Temperature Refractories*, Vol. 23, 1986, pp. 51-56.)

It has been found that the above-described belief is entirely wrong, and that the congruent composition for any solid complex oxide (which is stable at its melting temperature, in the presence of a stabilizing atmosphere, if necessary) is slightly, but very significantly, non-stoichiometric. Preferably, this congruent composition should exhibit a single chemical phase continuously between its melting temperature and 300° K. Thus, any congruent composition which exhibits more than one chemical phase when cooled from its melting temperature to 300° K. is not preferred. Moreover, the congruent compositions of complex oxides that differ from stoichiometry by less than 0.1 atomic percent are difficult to distinguish from the stoichiometric compositions, and thus are not encompassed by the present invention. In addition, it has been found that the (non-stoichiometric) congruent composition for any such complex oxide is readily determined by using a new, iterative procedure. In the first step of this procedure, a boule of the complex oxide under consideration (preferably of single chemical phase) is grown from a melt having the corresponding stoichiometric composition via the conventional Czochralski method, and the composition of the boule, which differs from stoichiometry, is determined to within 0.1 atomic percent using conventional chemical analysis techniques, e.g., conventional x-ray fluorescence techniques. To achieve an essentially uniform composition which approaches congruency, this boule should be relatively small, i.e., have a mass which is less than or equal to about 10 percent, and preferably less than or equal to about 5 percent, of the mass of the liquid melt. During the second step of the procedure, a second liquid melt is formed having a mass of at least 100 grams (gm) and having a composition of the previously grown (first) boule. Then, a new (second) boule is grown from this melt having a mass equal to at least 80 percent of the mass of the melt. Significantly, the refractive index or indices (if there is more than one type, e.g., the ordinary and extraordinary refractive indices) of this new boule are sensitive to variations in the composition of the boule. Consequently, the refractive index or indices are measured along the length of the outer surface of the boule using, for example, the prism coupling technique described by G. E. Peterson and S. R. Lunt in "Testing Lithium Niobate Boules For Integrated Optics Applications," *Electronics Letters,* June 5, 1986, Volume 22, Number 12, pp. 674–675. Provided the variation in each of the refractive indices of the new (second) boule, along the length of the outer surface of the boule, is less than or equal to about ±0.01 percent (from the top to the bottom of the boule), and preferably less than or equal to about ±0.001 percent, then, for the purposes of this invention, the entire boule is of substantially uniform composition, and the compositions of both the boule and the melt are the congruent composition. If the above refractive index criterion is not met, then the second step of the procedure is repeated following determination of the composition of just the top ten percent (by mass) of the new boule (the initially drawn 10 percent of the new boule), and preferably just the top 5 percent of the boule. That is, a liquid melt having this composition and having a mass of at least 100 gm is formed. Then, a boule having a mass equal to at least 80 percent of the mass of the newly-formed melt is grown, and the refractive indices along the length of the outer surface of the boule are measured, to see if the above refractive index criterion is met. (The second step of the above procedure may have to be repeated more than once. However, the compositions of the successive melts and boules do converge to the congruent composition.)

The above-described procedure is not only useful in finding the congruent composition of a complex oxide (preferably of single chemical phase), but is used to determine whether, for the purposes of the present invention, a given composition is the congruent composition for that complex oxide. That is, a liquid melt is formed having the given composition and having a mass equal to at least 100 gm. Then, a boule is grown from the melt, having a mass equal to at least 80 percent of the mass of the melt. If the refractive index variations along the length of the outer surface of this boule satisfy the above refractive index criterion, then the given composition is the congruent composition. (However, if the congruent composition differs from stoichiometry by less than 0.1 atomic percent for each constituent element, then the corresponding complex oxide is not encompassed by the present invention.)

In accord with the above discussion, it has been found, for example, that LMA exhibits a single chemical phase with a non-stoichiometric congruent composition given by $$La_{0.95\pm0.01}MgAl_{11.05\pm0.04}O_{19}, \qquad (5)$$

with the preferred composition being $$La_{0.950}MgAl_{11.050}O_{19}. \qquad (6)$$

The finding that the congruent compositions of all complex oxides are non-stoichiometric has great commercial significance. For example, current commercial techniques for growing boules of complex oxides from liquid melts still involve the use of melts having the corresponding stoichiometric compositions. Although the underlying problem was not previously recognized, manufacturers of boules have long known that it was necessary to limit the masses of the boules (in relation to the masses of the melts) to achieve boules having reasonably uniform compositions. That is, manufacturers of boules have typically converted about 30–50 percent of the masses of the liquid melts to solid boules, and have discarded the remaining 50–70 percent of the melts. However, by employing melts having congruent compositions (as defined above), it has been found that far more than 30–50 percent, and typically as much as 90 percent, of the masses of the liquid melts are readily converted into solid boules having substantially uniform compositions (as defined above).

The above finding (that complex oxides have non-stoichiometric congruent compositions) also has great significance for a wide variety of devices. That is, it has been found that many of the deficiencies associated with devices employing complex oxide materials derived from boules grown from stoichiometric melts are due to the fact that the melt compositions are non-congruent. For example, and as noted above, single crystal LMA has been proposed as a laser host. In particular, it has been proposed that LMA single crystals serve as hosts for neodymium ions (which are capable of lasing) because neodymium has a much higher distribution coefficient in LMA than in other hosts, such as yttrium aluminum garnet (YAG). As a consequence, neodymium-doped LMA lasers are potentially capable of achieving much higher power densities than, for example, neodymium-doped YAG lasers. However, attempts to grow LMA boules from melts having the stoichiometric composition (i.e., $LaMgAl_{11}O_{19}$, previously believed to be the congruent composition) have resulted in boules which are less than desirable for laser applications because they exhibit bubbles (voids), and crack during conventional processing. Significantly, it was always assumed that these bubbles and cracks were due to growth-related, rather than compositional, problems.

It has been found that LMA boules grown from melts having the congruent composition given by Eqs. (5) and (6) are essentially free of bubbles, and suffer essentially no cracks during processing. Consequently, and in accordance with the invention, a relatively high power density solid state laser 10 (see FIG. 1) is readily achieved by combining the reflectors 14 and 16 and source of pumping energy 20 with an active medium 12 which includes an LMA host doped with neodymium, where the host composition (in the absence of dopant) is given by Eq. (5).

Figure 2:
FIG. 2 is a cross-sectional view of a polarization rotator/optical isolator or of a face plate of a cathode ray tube, in accordance with a second embodiment of the invention.

The above finding is also significant in relation to a number of devices which include a relatively thin film 26 (see FIG. 2) overlying a substrate 28 of single crystal complex oxide, e.g., a garnet substrate. Among these devices are a variety of well known polarization rotators and optical isolators which include an iron-containing film 26 (which, in use, is magnetized) epitaxially grown on a garnet substrate 28, e.g., a film of rare earth-bismuth iron garnet grown on a substrate of, for example, substituted gadolinium gallium garnet. (In this regard see, e.g., C. P. Klages et al, supra.) In addition, many cathode ray tubes have face plates which include a relatively thin, phosphor-doped film 26 epitaxially grown on a garnet substrate 28, e.g., a cerium-doped YAG film epitaxially grown on a YAG substrate. (Regarding such cathode ray tubes see, e.g., J. M. Robertson and M. W. vanTol, *Thin Solid Films*, Vol. 114, 1984, p. 221.) In all these devices, the garnet substrates have previously been derived from boules grown from stoichiometric melts, in the mistaken belief that this would yield substrates of substantially uniform composition which, in turn, would preclude lattice mismatches between the substrates and the films, and thus preclude strains in the films. However, all these thin-film devices have been plagued by deficiencies. For example, the thin films employed in the polarization rotators/optical isolators often exhibit undesirable birefringence, which results in, for example, the optical isolators exhibiting relatively small extinction ratios. On the other hand, the thin films employed in the face plates of the cathode ray tubes often exhibit an undesirably large number of scattering sites, which limits the contrast of the cathode ray tubes.

It has been found that the deficiencies associated with the thin-film devices, described above, are almost entirely due to the fact that the garnet substrates are derived from boules grown from stoichiometric melts. That is, because the stoichiometric composition of each melt is not the congruent composition, the boule grown from the melt, and therefore the derived garnet substrate, does not have a substantially uniform composition. Consequently, the lattic parameters of the films are often different from those of the substrates, which lead to strains in the films, which in turn lead to the deficiencies. Thus, and in accordance with the invention, improved thin film devices, of the type described above, are achieved by forming the films on garnet substrates derived from boules grown from (non-stoichiometric) congruent melts.

Still other devices have been found to exhibit deficiencies because they too include complex oxide components derived from stoichiometric melts. For example, frequency doublers are devices which serve to double the frequency of incident light. Such devices typically include a non-centrosymmetric complex oxide material, e.g., the tungsten bronzes, such as strontium barium niobate. (See, e.g., J. C. Burfoot & G. W. Taylor, *Polar Dielectrics and Their Applications* (University of California, 1979), pp. 373–377.) To achieve uniform frequency doubling throughout the complex oxide, the refractive index or indices (if there is more than one type) should be constant. Because refractive indices are sensitive to composition, the complex oxide materials have previously been derived from stoichiometric melts in the belief that this would yield complex oxides of uniform composition. However, as discussed above, this belief is wrong and has been found to result in devices which exhibit nonuniform refractive indices. Thus, and in accordance with the invention, improved frequency doublers are achieved by employing non-centrosymmetric complex oxide materials derived from non-stoichiometric, congruent composition melts.

EXAMPLE 1

This example describes the conditions for reproducible growth of GSGG single crystals of predetermined composition by a modified Czochralski technique. X-ray fluorescence (XRF) was used to examine the compositional uniformity of these crystals, and that data was used to determine the congruent melting composition. Various materials, parameters, equipment etc. are identified by way of illustration only and, unless otherwise stated, are not intended to limit the scope of the invention.

Initially, a stoichiometric sintered (i.e., ceramic, non-single crystalline) sample of $Gd_{3.0}Sc_{2.0}Ga_{3.0}O_{12}$ was prepared to determine the lattice parameter of stoichiometric GSGG and for use as an XRF standard.

Next, single crystals were grown from an rf heated iridium crucible by the well-known Czochralski techique. The charges comprised 350 gm of predried $Gd_2O_3$, $Sc_2O_3$, and $Ga_2O_3$ that had been mixed and pressed into a compact. If the crystal is to be doped, then a pre-dried oxide of the desired dopant (e.g., $Cr_2O_3$, $Nd_2O_3$) would be mixed into the charges. In accordance with one aspect of our invention, the basic Czochralski technique was modified by pre-firing the pressed powder at about 1373° K. overnight for reasons discussed later. A suitable range is about 1173°–1973° K. for about 4–24 hours. The charges melted at a temperature of 2148° K. and were held there for at least one hour before beginning growth. A suitable range is about 2148°–2173° K. for about 1–3 hours. All crystals were grown along a <111> direction from a GSGG seed. A linear growth rate of 3.8 mm/hr and a rotation rate of 40 rpm produced a single crystal boule about 23 mm in diameter. The growth rate and rotation rate, however, are not critical.

To be certain of the sample composition, it was important to reduce possible sources of sample weight loss, which included: (1) Adsorbed moisture and gases. If the oxides are not pre-dried at high temperatures, this adsorption can be a substantial source of compositional error. In particular, the $Sc_2O_3$ lost 4 percent of its weight after an overnight bake-out. Drying at a temperature of about 1373° K. appeared to remove all adsorbed gases; (2) $Ga_2O_3$ evaporation. Since growth of GSGG is carried out at higher temperatures than that of GGG, the evaporation of gallium oxide is a more substantial problem in GSGG. For the growth of GGG an atmosphere of 2 percent oxygen in 98 percent nitrogen is sufficiently oxidizing to suppress the evaporation of $Ga_2O_3$. This atmosphere was used by previous researchers for the growth of GSGG. We found, however, that an atmosphere of 3 percent oxygen and 97 percent nitrogen by volume was more effective in suppressing $Ga_2O_3$ evaporation from the GSGG melt to below the limit of detection. Unfortunately, this relatively high oxygen concerntration results in some oxidation and evaporation from the iridium crucible. However, the rate of the process can be calibrated and hence accounted for. It is also possible that gallium oxide may evaporate from the pressed powder sample before melting occurs. To reduce such evaporation, we pre-fired the pressed powder overnight at 1273° K., as discussed above, to chemically bind the $Ga_2O_3$ into low vapor pressure phases; e.g., $GdGaO_3$ $Gd_4Ga_2O_9$, $Gd_6Ga_2O_{12}$, $Gd_3Ga_5O_{12}$, and Ga-Sc oxides; (3) Sample flaking. A persistent and irregular source of sample weight loss seemed to arise from flaking of the tall pressed powder charges during melting. If the sample is taller than the crucible (as generally occurs for low density, pressed powders), then these flakes can fall outside the crucible. Therefore, melting was done in two stages (melting half of the sample, then adding the rest) to assure that the sample did not extend above the top of the crucible.

When these procedures were followed, we achieved reproducible samples of known composition with no observable garnet weight loss. To increase the effect of any non-unity distribution coefficients the largest possible fraction of each melt was grown into the crystal (generally about 90 percent). Slices were cut from the top and bottom of each boule and were polished. The composition $Gd_xSc_yGa_zO_{12}$ of each slice was determined using XRF and well-known calculations. The XRF data and calculations of x, y and z were used to vary the GSGG melt composition iteratively until the top and bottom slices from the boule has the same composition, thus indicating that all distribution coefficients were unity to within the limits of measurement accuracy.

The boules grown from melts of stoichiometric and congruent compositions were sliced lengthwise, polished, and examined in a polariscope. Birefringence photographs clearly showed the strain associated with the growth striations and faceting at the growth interface in the stoichiometric boule. Also evident at the bottom of the crystal grown from a stoichiometric melt were areas of high dislocations and inclusions resulting from the breakdown of the growth interface. In contrast, birefringence photographs showed much less strain in the boule grown from our congruent melt composition. Some strain was seen near the top of the crystal where the interface became flat and also near the bottom of the crystal resulting from faceting on the growth interface. Growth striations, although still present, were significantly reduced in intensity and could be clearly seen only near the end of the crystal. No evidence of interface breakdown, as seen in the stoichiometric crystal, was observed despite that fact that greater than 90 percent of the liquid melt was crystallized.

In general, our technique enables 80-90 percent of the melt to be crystallized, whereas prior procedures achieved only about 30-50 percent usage. This increase, of course, implies greater yield from a given melt and hence a lower unit cost. The preferred congruent composition proved to be equation (4), or, expressed on a site-by-site basis equation (2), but closely related compositions are also essentially congruent if they fall within the ranges given by equations (1) and (3). The presence of 0.043 formula unit of dodecahedral Sc (equation (2)) was unexpected. Dodecahedral Sc had been seen in gadolinium scandium aluminum garnet by Brandle et al. (1973), supra, but it had not been observed in GSGG. On the contrary, it was predicted by Brandle et al. (1974), supra, that some gadolinium would be incorporated octahedrally as in GGG, resulting in a Gd content x>3.0 per formula unit, as discussed in Brandle et al. (1973), supra.

The lattice parameter of the sintered stoichiometric sample was determined using the method described by H. P. Klug and L. E. Alexander in *X-ray Diffraction Procedures for Polycrystalline and Amorphous Materials,* 2nd ed., John Wiley & Sons, New York, p. 306 (1974). The measured value of 12.583±0.001 Angstrom is consistent with the value 12.58 Angstrom determined by Chow et al., supra, and the value (12.587 Angstrom) that can be calculated by the method of Strocka et al., *Philips Journal of Research,* Vol. 33, p. 186, (1978), but is considerably higher than the stoichiometric value of 12.554 Angstrom calculated by Brandle et al. (1973), supra, and explains why our conclusions differ from theirs.

The lattice parameter of the XRF slices was determined using the method described by W. L. Bond in *Acta Crystallographica,* Vol. 13, p. 814 (1960) and *Acta Crystallographica,* Vol. A31, p. 698 (1975). The lattice parameter of our congruent melting compound of equations (2) and (4) is 12.560 Angstrom and is 0.023 Angstrom lower than the stoichiometric value. This result compares well with the difference of 0.020 Angstrom calculated from the composition by the method of Strocka et al., supra, and confirms the presence of dodecahedral Sc.

The density of the top of one sample was measured by weighing the sample in air and in carbon tetrachloride. The data was consistent with the presence of dodecahedral Sc. The measured value of 6.448±0.006 gm/cm$^3$ was quite close to the value calculated from composition and lattice parameter data (6.441 gm/cm$^3$), whereas the value calculated for the stoichiometric composition is 6.419 gm/cm$^3$, which is clearly much too low.

EXAMPLE 2

The congruent composition of LMA was determined using the procedure employed in Example 1. That is, the starting materials employed in the growth of an LMA crystal, i.e., $La_2O_3$, MgO and $Al_2O_3$, were pre-dried at 1373° K. for at least 12 hours to remove water and gases contained in all these materials, and particularly in the $La_2O_3$. Then, a stoichiometric mixture of the pre-dried materials, having a mass of 300 gm, was placed within an rf- heated iridium crucible, and melted by being heated to 2283°-2298° K. for 1 hour. An LMA seed, having its c axis normal to the desired growth direction, was inserted into the melt and withdrawn at the rate of 2.5 millimeters (mm) per hour while being rotated at 20 rpm. This resulted in the formation of an LMA crystal having a rectangular, prismatic shape with width, breadth and length dimensions of, respectively, 12 mm, 20 mm, and 70 mm, and a mass of about 70 grams.

The lattice constants, a and c, were measured along the length of the LMA crystal, at 295° K. These constants were found to be substantially uniform and to have the values a=5.589 Å and c=21.974 Å.

The density of the LMA crystal was measured by immersion in $CCl_4$, and was found to be 4.232±0.001 gm/cm$^3$. If the crystal composition were stoichiometric, then the density would have been 4.267 gm/cm$^3$. However, a composition represented by the formula $La_{0.95}MgAl_{11.05}O_{19}$ corresponds to a calculated density of 4.235 gm/cm$^3$, which is close to the measured value. Consequently, this composition is believed to be the congruent composition.

What is claimed is:

1. A device, comprising:
    a material including a complex oxide, characterized in that
    said complex oxide is essentially free of gadolinium scandium gallium garnet, gadolinium gallium garnet and lithium niobate, and the composition of said complex oxide is congruent and differs form stoichiometry by at least 0.1 atomic percent for at least one constituent element.

2. The device of claim 1 wherein said complex oxide exhibits a single chemical phase continuously between its melting temperature and 300° K.

3. The device of claim 1, wherein said device comprises a solid state laser having an active medium, said active medium including a host of said material including said complex oxide.

4. The device of claim 1, wherein said device is a polarization rotator.

5. The device of claim 1, wherein said device is an optical isolator.

6. The device of claim 1, wherein said device is a cathode ray tube having a face plate which includes said material including said complex oxide.

7. The device of claim 1, wherein said device is a frequency doubler.

8. A solid state laser, comprising:
an optical cavity resonator;
an active medium located within said resonator, said active medium including a single crystal lanthanum magnesium aluminate host doped with activator; and
means for supplying pumping energy to said medium to generate a population inversion therein and stimulated emission of optical radiation therefrom, characterized in that
in the absence of said activator, said lanthanum magnesium aluminate host has the composition $La_{0.95\pm 0.01}Mg\,Al_{11.05\pm 0.04}O_{19}$.

9. The solid state laser of claim 8 wherein, in the absence of said activator, said host has the composition $La_{0.950}Mg\,Al_{11.050}O_{19}$.

10. The solid state laser of claim 8 wherein said activator comprises neodymium.

11. A method for fabricating a device, comprising the steps of:
forming a crystal of a complex oxide; and
completing fabrication of said device, said completing including the step of incorporating at least a portion of said crystal into said device, characterized in that
said complex oxide is essentially free of gadolinium scandium gallium garnet, gadolinium gallium garnet and lithium niobate, and the composition of said complex oxide is congruent and differs from stoichiometry by at least 0.1 atomic percent for at least one constituent element.

12. The method of claim 11 wherein said complex oxide exhibits a single chemical phase continuously between its melting temperature and 300° K.

13. A composition of matter, comprising:
a complex oxide, characterized in that
said complex is essentially free of gadolinium scandium gallium garnet, gadolinium gallium garnet and lithium niobate, and the composition of said complex oxide is congruent and differs from stoichiometry by at least 0.1 atomic percent for at least one constituent element.

14. The composition of matter of claim 13 wherein said complex oxide exhibits a single chemical phase continuously between its melting temperature and 300° K.

15. The composition of matter of claim 13, wherein said complex oxide comprises lanthanum magnesium aluminate (LMA), the composition of said LMA being $La_{0.95\pm 0.01}MgAl_{11.05\pm 0.04}O_{19}$.

UNITED STATES PATENT AND TRADEMARK OFFICE
CERTIFICATE OF CORRECTION

PATENT NO. : 4,740,975
DATED : April 26, 1988
INVENTOR(S) : Sidney C. Abrahams, Charles D. Brandle, Jr.

It is certified that error appears in the above-identified patent and that said Letters Patent is hereby corrected as shown below:

Column 1, line 24, "Crdoped" should read --Cr-doped--.
Column 1, line 55, "lattic" should read --lattice--.
Column 2, line 27, "concentrtions" should read --concentrations--.
Column 7, line 33, "lattic" should read --lattice--.
Column 9, line 36, "that fact that" should read --the fact that--.
Column 12, line 21, "said complex is" should read --said complex oxide is--.

Signed and Sealed this

Ninth Day of July, 1991

Attest:

HARRY F. MANBECK, JR.

Attesting Officer     Commissioner of Patents and Trademarks